(12) United States Patent
Roberts

(10) Patent No.: US 8,860,048 B2
(45) Date of Patent: *Oct. 14, 2014

(54) THREE DIMENSIONAL LIGHT EMITTING DIODE SYSTEMS, AND COMPOSITIONS AND METHODS RELATING THERETO

(71) Applicant: E I du Pont de Nemours and Company, Wilmington, DE (US)

(72) Inventor: Kurt Douglas Roberts, Raleigh, NC (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 58 days.

This patent is subject to a terminal disclaimer.

(21) Appl. No.: 14/059,570

(22) Filed: Oct. 22, 2013

(65) Prior Publication Data
US 2014/0056002 A1    Feb. 27, 2014

Related U.S. Application Data

(63) Continuation of application No. 13/326,623, filed on Dec. 15, 2011, now Pat. No. 8,637,880.

(60) Provisional application No. 61/426,381, filed on Dec. 22, 2010.

(51) Int. Cl.
| | |
|---|---|
| H01L 29/18 | (2006.01) |
| H01L 25/075 | (2006.01) |
| F21S 4/00 | (2006.01) |
| F21V 29/00 | (2006.01) |
| H05K 1/18 | (2006.01) |
| H05K 1/02 | (2006.01) |
| H01L 33/64 | (2010.01) |
| H05K 3/00 | (2006.01) |
| F21Y 101/02 | (2006.01) |
| F21Y 103/00 | (2006.01) |

(52) U.S. Cl.
CPC .............. *F21V 29/22* (2013.01); *H05K 1/0278* (2013.01); *H01L 33/642* (2013.01); *H05K 2201/09745* (2013.01); *H01L 25/0753* (2013.01); *H05K 3/0061* (2013.01); *F21S 4/006* (2013.01); *F21Y 2101/02* (2013.01); *H05K 2201/10106* (2013.01); *H05K 1/189* (2013.01); *F21Y 2103/003* (2013.01)
USPC .......................................................... 257/88

(58) Field of Classification Search
CPC .................................................... H01L 25/0753
USPC .................................... 257/88, 676, E25.032
See application file for complete search history.

(56) References Cited

U.S. PATENT DOCUMENTS

| | | | |
|---|---|---|---|
| 5,769,533 A | 6/1998 | Yamuro et al. | |
| 5,920,643 A | 7/1999 | White et al. | |

(Continued)

FOREIGN PATENT DOCUMENTS

WO    2009/073670 A1    6/2009

OTHER PUBLICATIONS

U.S. Appl. No. 13/326,629, filed Dec. 15, 2011, Roberts.

(Continued)

*Primary Examiner* — Brook Kebede

(57) ABSTRACT

A flexible layered structure is disclosed having a flexible top conductive layer, a flexible bottom heat sink layer and a flexible dielectric middle layer. The combination has a longitudinal axis and a plurality of defined positions spaced along the longitudinal axis. The defined positions can be used for aligning a circuit and/or for the placement of LED lights. The flexible layered structure can be easily bent to form a LED substrate for shining light in more than one direction while efficiently removing heat arising from the LEDs.

5 Claims, 2 Drawing Sheets

(56) References Cited

U.S. PATENT DOCUMENTS

| | | |
|---|---|---|
| 6,183,104 B1 | 2/2001 | Ferrara |
| 6,290,713 B1 | 9/2001 | Russell |
| 6,502,968 B1 | 1/2003 | Simon |
| 7,086,756 B2 | 8/2006 | Maxik |
| 7,201,511 B2 | 4/2007 | Moriyama et al. |
| 7,210,818 B2 | 5/2007 | Luk et al. |
| 7,284,882 B2 | 10/2007 | Burkholder |
| 2004/0160768 A1 | 8/2004 | Cok |
| 2004/0223327 A1* | 11/2004 | Kuan et al. .................. 362/249 |
| 2004/0223328 A1* | 11/2004 | Lee et al. .................... 362/249 |
| 2005/0174769 A1 | 8/2005 | Yong et al. |
| 2009/0226656 A1 | 9/2009 | Crandell et al. |
| 2012/0182755 A1* | 7/2012 | Wildner ...................... 362/555 |

OTHER PUBLICATIONS

U.S. Appl. No. 13/326,619, filed Dec. 15, 2011, Roberts.
IMAPS Advanced Technology Workshop on Packaging and Assembly of Power LEDs; Sep. 13-15, 2006, XP-002519227.

* cited by examiner

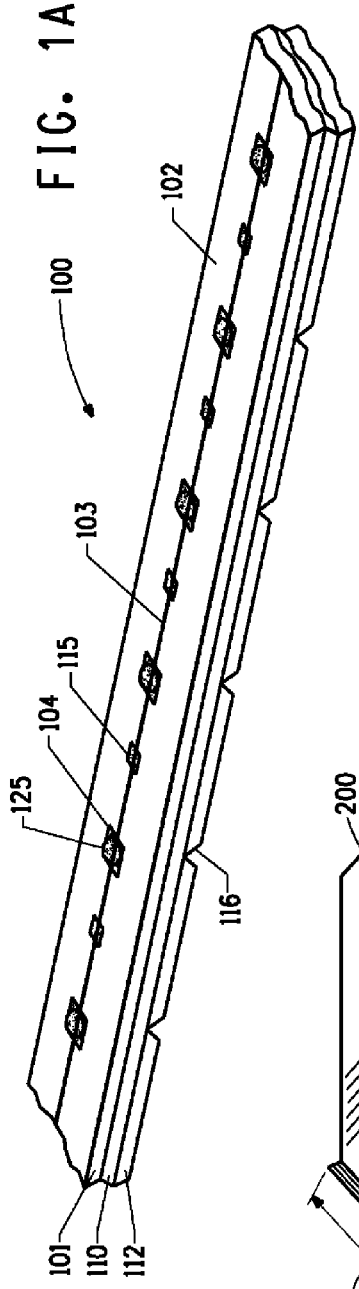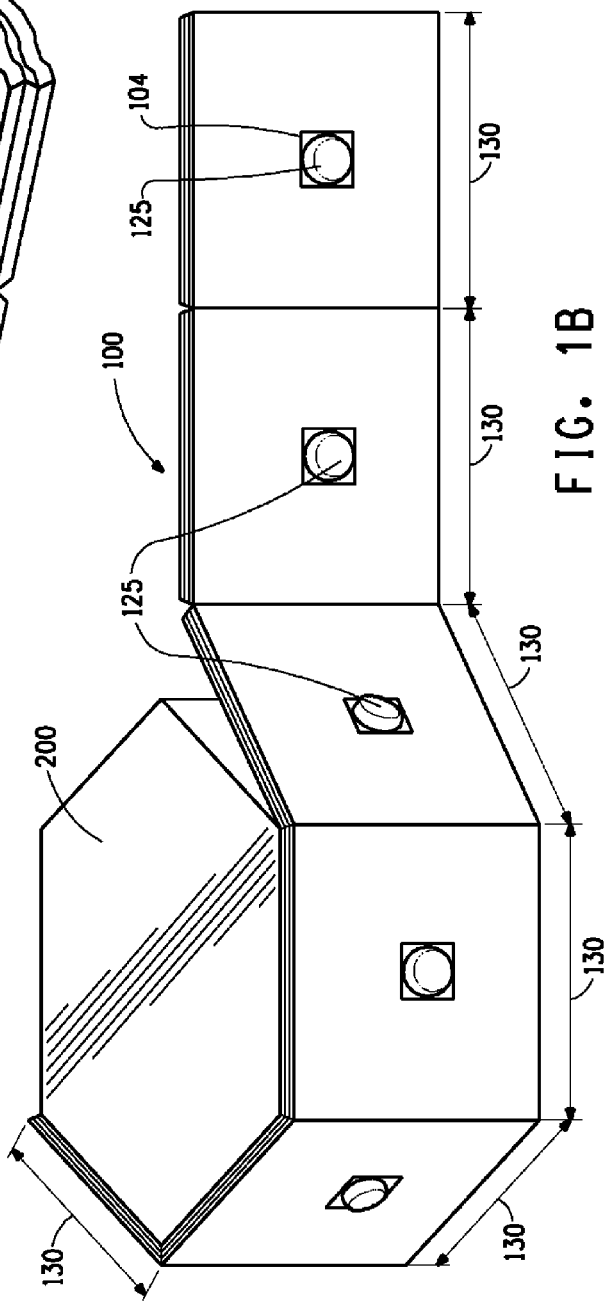

THREE DIMENSIONAL LIGHT EMITTING DIODE SYSTEMS, AND COMPOSITIONS AND METHODS RELATING THERETO

FIELD OF THE INVENTION

The field of the invention is light emitting diode ("LED") structures for three dimensional lighting applications.

BACKGROUND OF THE INVENTION

U.S. 2009/0226656 A1 is directed to a multi-layered structure for use with a high power, light emitting diode system. The structure is at least semi-flexible and is exemplified as comprising an FR4 epoxy based material that may also include a layer of fiberglass. Typically these structures are not capable of maintaining the bend or keeping the position the structure is bent or twisted to form.

Automotive backlights have been known to use LEDs, but are; very low power, have low heat dissipation, operate at much lower voltages and have shorter in use life than general lighting fixtures and replacement bulbs. Therefore there is a need for higher power LED lighting systems that have much higher heat dissipation, tested at much higher voltages required for safety recognition (as much as 250× the voltage required for automotive lighting), with expected in use life of over 25,000 hours of continuous usage and LED lighting applications requiring improved quality of light with design freedom and design for assembly or manufacture.

SUMMARY OF THE INVENTION

The present disclosure is directed to an LED lighting assembly. The LED lighting assembly comprises a flexible layered structure having a flexible top conductive layer. At least a portion of the flexible top conductive layer is a metal. The flexible top conductive layer has a thickness from 4, 6, 8, 10, 12, 15, or 20 microns to 50, 75, 100, 200, or 300 microns. The flexible layered structure also comprises a flexible bottom heat sink layer having a thickness of at least 10, 20, 25, 30, 40, 50, 75 or 100 microns. In some embodiments, the flexible bottom heat sink layer has a thickness up to and including 4000 microns. In some embodiments, the flexible bottom heat sink layer has a thickness between and including any two of the following: 10, 100, 500, 1000, 2000, 3000 and 4000 microns. At least a portion of the flexible bottom heat sink layer is a metal which can be the same or different from the metal of the flexible top conductive layer. The flexible layered structure of the present disclosure also comprises a flexible dielectric middle layer comprising a polymer. The flexible dielectric middle layer has a thickness from 1 to 100 microns and provides electrical insulation between the flexible top conductive layer and the flexible bottom heat sink layer.

The flexible layered structure having a longitudinal axis and a plurality of defined positions spaced along the longitudinal axis. The defined positions can be used for aligning a circuit or for the placement of LED lights. In some embodiments, the defined positions can also have a notch, to aid in bending the flexible layered structure. A notch is intended to mean any indentation into either the flexible top conductive layer or flexible bottom heat sink layer, whether by cutting, pressing, abrading, etching or otherwise. The combined flexible top conductive layer, middle dielectric layer and flexible bottom heat sink layer combine to form a structure that is bent at least 10, 20, 30, 40, 45, 60, 90, 120 or 180 degrees proximate to at least one of the defined positions spaced along the longitudinal axis and the combination is also twistable relative to the longitudinal axis. Twistable is intended to mean a torsion force of about 10 Newtons can deflect the flexible layered structure at least 5, 10, 15, 20, 25, or 30 degrees when the distance of the flexible layered structure experiencing the torsion force is about 25 centimeters. At least a portion of the plurality of defined positions comprise an LED and the LED is in electrical communication with a circuit.

BRIEF DESCRIPTION OF THE DRAWINGS

FIG. 1A is a perspective view of a flexible layered structure for use with high power light emitting diode systems.

FIG. 1B is a perspective view of a flexible layered structure conforming to the structure of a secondary heat sink.

DETAILED DESCRIPTION OF THE PREFERRED EMBODIMENT(S)

Definitions

Figure 2:
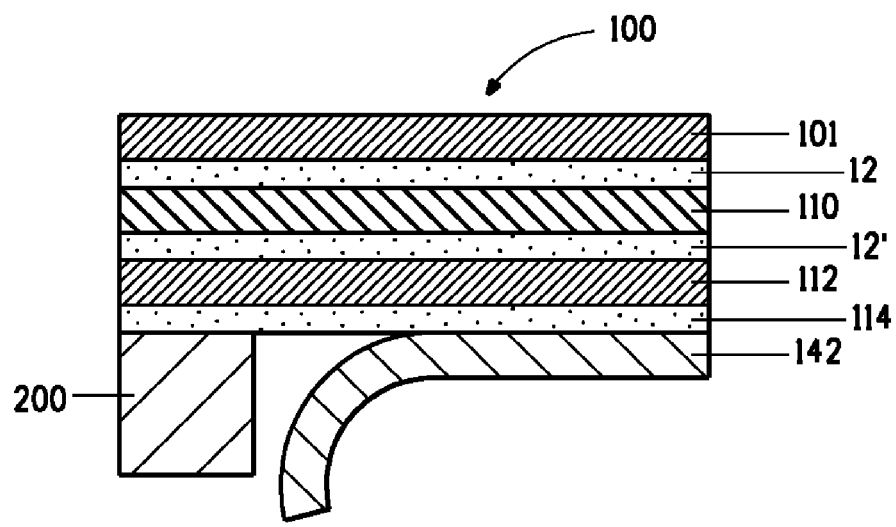
FIG. 2 is a cross-section view of an alternative embodiment of the flexible layered structure of the present disclosure.

"Flexible" is intended to mean bendable or twistable to a desire position or formation, after which maintains the position or formation. After bending or twisting, the resulting three dimensional structures may be rigid.

"Film" is intended to mean a free-standing film or a (self-supporting or non self-supporting) coating and includes multiple layers. The term "film" is used interchangeably with the term "layer" or "multilayer" and refers to covering a desired area.

"Layer" is intended to include circuitized layers, such as where a metal layer is patterned by photolithography to produce a pattern of metal traces or circuits.

"Dianhydride" as used herein is intended to include precursors or derivatives thereof, which may not technically be a dianhydride but would nevertheless react with a diamine to form a polyamic acid which could in turn be converted into a polyimide.

Similarly, "diamine" as used herein is intended to include precursors or derivatives thereof, which may not technically be a diamine but would nevertheless react with a dianhydride to form a polyamic acid which could in turn be converted into a polyimide.

An "aromatic diamine" is intended to mean a diamine having at least one aromatic ring, either alone (i.e., a substituted or unsubstituted, functionalized or unfunctionalized benzene or similar-type aromatic ring) or connected to another (aromatic or aliphatic) ring, and such an amine is to be deemed aromatic, regardless of any non-aromatic moieties that might also be a component of the diamine. Hence, an aromatic diamine backbone chain segment is intended to mean at least one aromatic moiety between two adjacent imide linkages.

"Polyamic acid" as used herein is intended to include any polyimide precursor material derived from a combination of dianhydride and diamine monomers or functional equivalents thereof and capable of conversion to a polyimide.

"Sub-micron" is intended to describe particles having (as a numerical average) at least one dimension that is less than a micron.

"Chemical conversion" or "chemically converted" as used herein denotes the use of a catalyst (accelerator) or dehydrating agent (or both) to convert the polyamic acid to polyimide and is intended to include a partially chemically converted polyimide which is then dried at elevated temperatures to a solids level greater than 98%.

In describing certain polymers it should be understood that sometimes applicants are referring to the polymers by the monomers used to make them or the amounts of the monomers used to make them. While such a description may not include the specific nomenclature used to describe the final polymer or may not contain product-by-process terminology, any such reference to monomers and amounts should be interpreted to mean that the polymer is made from those monomers, unless the context indicates or implies otherwise.

As used herein, the terms "comprises," "comprising," "includes," "including," "has," "having" or any other variation thereof, are intended to cover a non-exclusive inclusion. For example, a method, process, article, or apparatus that comprises a list of elements is not necessarily limited to only those elements but may include other elements not expressly listed or inherent to such method, process, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, articles "a" or "an" are employed to describe elements and components of the invention. This is done merely for convenience and to give a general sense of the invention. This description should be read to include one or at least one and the singular also includes the plural unless it is obvious that it is meant otherwise.

Overview

The present disclosure is directed to a flexible layered structure adapted for use as part of a high power (e.g., greater than 0.25, 0.5, 1, 2, 3, 4, 5, 8 10, 15, 20 or 25 watts per LED) light emitting diode system. The flexible layered structure comprises a flexible top conductive layer, a flexible dielectric middle layer and a flexible bottom heat sink layer. Optionally between any of these three layers is an adhesive layer having a thickness from 1 to 55 microns. Optionally, the flexible dielectric middle layer comprises thermally conductive filler from the group consisting of carbides, nitrides, borides and oxides. Optionally, a heat sink adhesive layer is applied to the flexible bottom heat sink layer with a release liner on the opposite side; such that, the release liner can be removed and the flexible layered structure bonded to a housing, secondary heat sink or other structure.

The flexible top conductive layer has a thickness from 4, 6, 8, 10, 12, 15, or 20 microns to 50, 75, 100, 200, or 300 microns and comprises a metal. The flexible top conductive layer is thermally and electrically conductive. The flexible bottom heat sink layer has a thickness of at least 10, 20, 25, 30, 40, 50, 75 or 100 microns. In some embodiments, the flexible bottom heat sink layer has a thickness up to and including 4000 microns. In some embodiments, the flexible bottom heat sink layer has a thickness between and including any two of the following: 10, 100, 500, 1000, 2000, 3000 and 4000 microns. In some embodiments, the flexible bottom heat sink layer comprises a metal. The metal of the flexible top conductive layer can be the same or different from the metal of the flexible bottom heat sink layer. In some embodiments, the flexible dielectric middle layer has a thickness from 1 to 100 microns. In some embodiments, the flexible dielectric middle layer has a thickness between and including any two of the following: 1, 5, 10, 20, 30, 40, 50, 60, 70, 80, 90 and 100 microns. In some embodiments, the flexible dielectric middle layer is from about 4 to about 100 microns in thickness and comprises a mechanically strong, heat resistant polymer, such as a polyester (such as polyethylene terephthalate or polybutylene terephthalate), fluoropolymer, acrylonitrile butadiene styrene ("ABS"), polycarbonates ("PC"), polyamides ("PA"), polyphenylene oxide ("PPO"), polysulphone ("PSU"), polyetherketone ("PEK"), polyetheretherketone ("PEEK"), polyimides ("PI"), polyphenylene sulfide ("PPS"), polyoxymethylene plastic ("POM"), polyethylene naphthalate ("PEN"), or the like.

The flexible top conductive layer, the flexible dielectric middle layer, and the flexible bottom heat sink layer form a flexible layered structure having a longitudinal axis and a plurality of LED receptacles on the top. The LED receptacles are the areas the LED is electrically attached. The LED receptacles are ultimately filled with LED devices and powered at least in part by the flexible top conductive layer. In some embodiments, the flexible top conductive layer comprises at least one LED connected to at least one surface mount technology electrical component by an electrical circuit.

The flexible elongate member is bendable laterally proximate the plurality of LED receptacles spaced along the longitudinal axis and the flexible elongated member is twistable relative to its longitudinal axis. The flexible elongated member can be bent and/or twisted so at least two of the LED lights are directed to and shine in different directions. In one embodiment, the twisted and/or bent LED configuration is incorporated into a housing adapted either as a lighting system itself or as a replacement bulb for a lighting system. Optionally, the heat sink layer can be partially or wholly bonded to an additional heat sink material in one embodiment, a flexible layered structure (sometimes also referred to as a "flexible member") for use with high power light emitting diode systems. In one embodiment, FIG. 1A illustrates a flexible layered structure 100. The flexible layered structure 100 comprises a flexible dielectric middle layer 110 sandwiched between a flexible top conductive layer 101 and a flexible bottom heat sink layer 112. The flexible top conductive layer 101 comprises a first conductive metal and the flexible bottom heat sink layer 112 comprises a second conductive metal. The first conductive metal of the flexible top conductive layer 101 being the same or different from the second conductive metal of the flexible bottom heat sink layer 112. In some embodiments, the first conductive metal of the flexible top conductive layer 101 and the second conductive metal of the flexible bottom heat sink layer 112 each comprise one or more metals or metal alloys. The flexible layered structure 100 has a plurality of LED receptacles 104 to which LEDs 125 are operatively connected to other Surface Mount Technology (hereinafter "SMT") electrical components 115 by electrical circuit 103 resulting from circuitizing the flexible top conductive layer 101. In some embodiments, the flexible bottom heat sink layer contains a plurality of notches 116 to aid in bending the flexible layered structure 100. A notch is intended to mean any indentation into either the flexible top conductive layer or flexible bottom heat sink layer, whether by cutting, pressing, abrading, etching or otherwise. In some embodiments, the notch(es) are on the top or the bottom of the flexible layered structure 100.

FIG. 1B illustrates a flexible layered structure 100 bent to conform to at least a portion of a secondary heat sink 200. The secondary heat sink may be solid, hollow, have radiating fins or any construction suitable to desired use. The flexible layered structure 100 has a plurality of defined positions 130 along the longitudinal axis. The defined positions 130 may comprise a notch to aid in bending the flexible layered structure 100. In an alternative embodiment, a plurality of individual secondary heat sinks can be bonded to defined positions of the flexible layered structure bent or shaped in to a 3-D structure. In some embodiments, the flexible layered structure also comprises a heat sink adhesive layer. Referring now to FIG. 2, in addition to a flexible top conductive layer 101, flexible dielectric middle layer 110 and a flexible bottom heat sink layer 112, the flexible layered structure 100 comprises a heat sink adhesive layer 114 having a top surface and a bottom surface. In such an embodiment, the top surface of the heat sink adhesive layer 114 is bonded to the bottom surface of the flexible bottom heat sink layer 112. In such an embodiment, the bottom surface of the heat sink adhesive layer 114 is covered by a release liner 142. The release liner protects the heat sink adhesive layer 114 until the release liner 142 can be removed and a secondary heat sink 200 can be applied to the heat sink adhesive layer 114 that is exposed.

FIG. 2 additionally illustrates another embodiment in which the flexible layered structure 100 comprises an adhesive layer 12 which bonds the flexible top conductive layer 101 to the flexible dielectric middle layer 110 and an adhesive layer 12' bonding the flexible dielectric middle layer 110 to the flexible bottom heat sink layer 112. In some embodiments, the adhesive layer 12 and the adhesive layer 12' are the same material. In some embodiments, the adhesive layer 12 and the adhesive layer 12' are different materials.

In an alternative embodiment, the flexible layered structure is conformed to at least a portion of a secondary heat sink and bonded to the secondary heat sink by at least a portion of the heat sink adhesive layer. In another embodiment, at least a portion of the flexible layered structure is bent by at least 10 degrees. In another embodiment, at least a portion of the flexible layered structure is bent by at least 36 degrees. In another embodiment, at least a portion of the flexible layered structure is bent by at least 45 degrees. In another embodiment, at least a portion of the flexible layered structure is bent by at least 60 degrees. In another embodiment, at least a portion of the flexible layered structure is bent by at least 72 degrees. In another embodiment, at least a portion of the flexible layered structure is bent by at least 90 degrees. In another embodiment, at least a portion of the flexible layered structure is bent by at least 120 degrees. In yet another alternative embodiment, at least one conductive layer comprises an electrical circuit. In another embodiment, the defined positions comprise a notch on the top or the bottom of the flexible layered structure. In some embodiments, the defined positions comprise a notch on the flexible bottom heat sink layer or the flexible top conductive layer.

In another embodiment, at least 50 weight percent of the flexible dielectric middle layer is a polyimide derived from at least 30 mole percent aromatic dianhydride based upon total dianhydride content of the polyimide and at least 30 mole percent aromatic diamine based upon total diamine content of the polyimide. In yet another alternative embodiment, the flexible dielectric middle layer comprises 1 to 50 weight percent of a thermally conductive filler, the thermally conductive filler comprises one or more members of the group consisting of carbides, nitrides, borides and oxides.

In some embodiments, the flexible layered structure further comprises a heat sink adhesive layer having a top surface and a bottom surface, the top surface of the heat sink adhesive layer being bonded to the bottom surface of the flexible bottom heat sink layer and the bottom surface of the heat sink adhesive layer being covered by a release liner.

Flexible Dielectric Middle Layer

In some embodiments, the flexible dielectric middle layer is a mechanically strong, heat resistant polymer, such as a polyester (such as polyethylene terephthalate or polybutylene terephthalate), fluoropolymer, acrylonitrile butadiene styrene ("ABS"), polycarbonates ("PC"), polyamides ("PA"), polyphenylene oxide ("PPO"), polysulphone ("PSU"), polyetherketone ("PEK"), polyetheretherketone ("PEEK"), polyphenylene sulfide ("PPS"), polyoxymethylene plastic ("POM"), polyethylene naphthalate ("PEN"), or the like.

An adhesive layer can be provided on one or both sides (12 and/or 12') of the flexible dielectric middle layer. The flexible dielectric middle layer is an electrically insulating thermally conductive layer, wholly or partially providing an electrical insulation barrier between the flexible top conductive layer and the flexible bottom heat sink layer. In one embodiment, the flexible dielectric middle layer is approximately 1 to 100 microns thick, and can be of virtually any width or length. In some embodiments, the flexible dielectric middle layer is from 4 to 100 microns thick. In some embodiments, the flexible dielectric middle layer is a polyimide layer. In one embodiment, the polyimide layer has a breakdown voltage of greater than 0.1, 0.5, 1, 5, 10 or 20 kilovolts (kV), and a (DMA) tensile strength at 480° C. of at least 100, 200, 250, 300, 350, 400, 450, 500, 550, 600, 650, 700, 750, 800, 850, 900, 950, 1000, 1100, 1200, 1300, 1400 or 1500 MPa. In one embodiment, the thermal conductivity of the polyimide is at least 0.05, 0.1, 0.2, 0.3 0.4, 0.5, 1, 2 or 3 Watts per meter per degree Kelvin (W/mK).

Examples of polyimide materials useful as the flexible dielectric middle layer in accordance with the present disclosure include polyimides derived from dianhydride type and diamine type precursor materials. In some embodiments, at least 50 weight percent of the flexible dielectric middle layer is a polyimide derived from at least 30 mole percent aromatic dianhydride based upon total dianhydride content of the polyimide and at least 30 mole percent aromatic diamine based upon total diamine content of the polyimide. In some embodiments, the remaining diamine may be an aliphatic diamine. As used herein, an "aliphatic diamine" is intended to mean any organic diamine that does not meet the definition of an aromatic diamine. In one embodiment, useful aliphatic diamines have the following structural formula: $H_2N$—R—$NH_2$, where R is an aliphatic moiety, such as a substituted or unsubstituted hydrocarbon in a range from 4, 5, 6, 7 or 8 carbons to about 9, 10, 11, 12, 13, 14, 15, or 16 carbon atoms, and in one embodiment the aliphatic moiety is a $C_6$ to $C_8$ aliphatic.

In one embodiment, R is a $C_6$ straight chain hydrocarbon, known as hexamethylene diamine (HMD or 1,6-hexanediamine). In other embodiments, the aliphatic diamine is an alpha, omega-diamine; such diamines can be more reactive than alpha, beta-aliphatic diamines.

Useful aromatic diamines for example, are selected from the group comprising:
 1. 2,2 bis-(4-aminophenyl)propane;
 2. 4,4'-diaminodiphenyl methane;
 3. 4,4'-diaminodiphenyl sulfide;
 4. 3,3'-diaminodiphenyl sulfone (3,3'-DDS);
 5. 4,4'-diaminodiphenyl sulfone (4,4'-DDS);
 6. 4,4'-diaminodiphenyl ether (4,4'-ODA);
 7. 3,4'-diaminodiphenyl ether (3,4'-ODA);
 8. 1,3-bis-(4-aminophenoxy)benzene (APB-134 or RODA);
 9. 1,3-bis-(3-aminophenoxy)benzene (APB-133);
 10. 1,2-bis-(4-aminophenoxy)benzene;
 11. 1,2-bis-(3-aminophenoxy)benzene;
 12. 1,4-bis-(4-aminophenoxy)benzene;
 13. 1,4-bis-(3-aminophenoxy)benzene;
 14. 1,5-diaminonaphthalene;
 15. 1,8-diaminonaphthalene;
 16. 2,2'-bis(trifluoromethyl)benzidine;

17. 4,4'-diaminodiphenyldiethylsilane;
18. 4,4'-diaminodiphenylsilane;
19. 4,4'-diaminodiphenylethylphosphine oxide;
20. 4,4'-diaminodiphenyl-N-methyl amine;
21. 4,4'-diaminodiphenyl-N-phenyl amine;
22. 1,2-diaminobenzene (OPD);
23. 1,3-diaminobenzene (MPD);
24. 1,4-diaminobenzene (PPD);
25. 2,5-dimethyl-1,4-diaminobenzene;
26. 2-(trifluoromethyl)-1,4-phenylenediamine;
27. 5-(trifluoromethyl)-1,3-phenylenediamine;
28. 2,2-Bis[4-(4-aminophenoxy)phenyl]-hexafluoropropane (BDAF);
29. 2,2-bis(3-aminophenyl) 1,1,1,3,3,3-hexafluoropropane;
30. benzidine;
31. 4,4'-diaminobenzophenone;
32. 3,4'-diaminobenzophenone;
33. 3,3'-diaminobenzophenone;
34. m-xylylene diamine;
35. bisaminophenoxyphenylsulfone;
36. 4,4'-isopropylidenedianiline;
37. N,N-bis-(4-aminophenyl) methylamine;
38. N,N-bis-(4-aminophenyl) aniline;
39. 3,3'-dimethyl-4,4'-diaminobiphenyl;
40. 4-aminophenyl-3-aminobenzoate;
41. 2,4-diaminotoluene;
42. 2,5-diaminotoluene;
43. 2,6-diaminotoluene;
44. 2,4-diamine-5-chlorotoluene;
45. 2,4-diamine-6-chlorotoluene;
46. 4-chloro-1,2-phenylenediamine;
47. 4-chloro-1,3-phenylenediamine;
48. 2,4-bis-(beta-amino-t-butyl)toluene;
49. bis-(p-beta-amino-t-butyl phenyl)ether;
50. p-bis-2-(2-methyl-4-aminopentyl)benzene;
51. 1-(4-aminophenoxy)-3-(3-aminophenoxy)benzene;
52. 1-(4-aminophenoxy)-4-(3-aminophenoxy)benzene;
53. 2,2-bis-[4-(4-aminophenoxy)phenyl]propane (BAPP);
54. bis-[4-(4-aminophenoxy)phenyl]sulfone (BAPS);
55. 2,2-bis[4-(3-aminophenoxy)phenyl]sulfone (m-BAPS);
56. 4,4'-bis-(aminophenoxy)biphenyl (BAPB);
57. bis-(4-[4-aminophenoxy]phenyl)ether (BAPE);
58. 2,2'-bis-(4-aminophenyl)-hexafluoropropane (6F diamine);
59. bis(3-aminophenyl)-3,5-di(trifluoromethyl)phenylphosphine oxide
60. 2,2'-bis-(4-phenoxy aniline) isopropylidene;
61. 2,4,6-trimethyl-1,3-diaminobenzene;
62. 4,4'-diamino-2,2'-trifluoromethyl diphenyloxide;
63. 3,3'-diamino-5,5'-trifluoromethyl diphenyloxide;
64. 4,4'-trifluoromethyl-2,2'-diaminobiphenyl;
65. 4,4'-oxy-bis-[(2-trifluoromethyl)benzene amine];
66. 4,4'-oxy-bis-[(3-trifluoromethyl)benzene amine];
67. 4,4'-thio-bis-[(2-trifluoromethyl)benzene-amine];
68. 4,4'-thiobis-[(3-trifluoromethyl)benzene amine];
69. 4,4'-sulfoxyl-bis-[(2-trifluoromethyl)benzene amine;
70. 4,4'-sulfoxyl-bis-[(3-trifluoromethyl)benzene amine];
71. 4,4'-keto-bis-[(2-trifluoromethyl)benzene amine];
72. 9,9-bis(4-aminophenyl)fluorene;
73. 1,3-diamino-2,4,5,6-tetrafluorobenzene;
74. 3,3'-bis(trifluoromethyl)benzidine;
75. 3,3'-diaminodiphenylether;
76. and the like.

Useful aliphatic diamines used in conjunction with the aromatic diamine include (but are not limited to) 1,6-hexamethylene diamine, 1,7-heptamethylene diamine, 1,8-octamethylenediamine, 1,9-nonamethylenediamine, 1,10-decamethylenediamine (DMD), 1,11-undecamethylenediamine, 1,12-dodecamethylenediamine (DDD), 1,16-hexadecamethylenediamine, 1,3-bis(3-aminopropyl)-tetramethyldisiloxane, α,ω-bis(3-aminopropyl)polydimethylsiloxane, isophoronediamine, and combinations thereof. Any cycloaliphatic diamine can also be used, an example of which is 1, 4 diamino cyclohexane.

In one embodiment of the present invention (in order to achieve a low temperature bonding) diamines comprising ether linkages and or diamines comprising aliphatic functional groups are used. The term low temperature bonding is intended to mean bonding two materials in a temperature range of from about 180, 185, or 190° C. to about 195, 200, 205, 210, 215, 220, 225, 230, 235, 240, 245 or 250° C.

Similarly, the term dianhydride as used herein is intended to mean a component that reacts with (or is complimentary to) a diamine, and in combination is capable of reacting to form an intermediate polyamic acid (which can then be cured into a polyimide). Depending upon the context, "anhydride" as used herein can mean not only an anhydride moiety per se, but also a precursor to an anhydride moiety, such as: (i) a pair of carboxylic acid groups (which can be converted to anhydride by a de-watering or similar-type reaction); or (ii) an acid halide (e.g., chloride) ester functionality (or any other functionality presently known or developed in the future which is) capable of conversion to anhydride functionality.

Depending upon context, "dianhydride" can mean: (i) the unreacted form (i.e., a dianhydride monomer, whether the anhydride functionality is in a true anhydride form or a precursor anhydride form, as discussed in the prior above paragraph); (ii) a partially reacted form (i.e., the portion or portions of an oligomer or other partially reacted or precursor polyimide composition reacted from or otherwise attributable to dianhydride monomer) or (iii) a fully reacted form (the portion or portions of the polyimide derived from or otherwise attributable to dianhydride monomer).

The dianhydride can be functionalized with one or more moieties, depending upon the particular embodiment selected in the practice of the present invention. Indeed, the term "dianhydride" is not intended to be limiting (or interpreted literally) as to the number of anhydride moieties in the dianhydride component. For example, (i), (ii) and (iii) (in the paragraph above) include organic substances that may have two, one, or zero anhydride moieties, depending upon whether the anhydride is in a precursor state or a reacted state. Alternatively, the dianhydride component may be functionalized with additional anhydride type moieties (in addition to the anhydride moieties that react with diamine to provide a polyimide). Such additional anhydride moieties could be used to crosslink the polymer or to provide other functionality to the polymer.

Useful dianhydrides of the present invention include aromatic dianhydrides. These aromatic dianhydrides include, (but are not limited to):

1. pyromellitic dianhydride (PMDA);
2. 3,3',4,4'-biphenyl tetracarboxylic dianhydride (BPDA);
3. 3,3',4,4'-benzophenone tetracarboxylic dianhydride (BTDA);
4. 4,4'-oxydiphthalic anhydride (ODPA);
5. 3,3',4,4'-diphenylsulfone tetracarboxylic dianhydride (DSDA);
6. 2,2-bis(3,4-dicarboxyphenyl) 1,1,1,3,3,3-hexafluoropropane dianhydride (6FDA);
7. 4,4'-(4,4'-isopropylidenediphenoxy)bis(phthalic anhydride) (BPADA);

8. 2,3,6,7-naphthalene tetracarboxylic dianhydride;
9. 1,2,5,6-naphthalene tetracarboxylic dianhydride;
10. 1,4,5,8-naphthalene tetracarboxylic dianhydride;
11. 2,6-dichloronaphthalene-1,4,5,8-tetracarboxylic dianhydride;
12. 2,7-dichloronaphthalene-1,4,5,8-tetracarboxylic dianhydride;
13. 2,3,3',4'-biphenyl tetracarboxylic dianhydride;
14. 2,2',3,3'-biphenyl tetracarboxylic dianhydride;
15. 2,3,3',4'-benzophenone tetracarboxylic dianhydride;
16. 2,2',3,3'-benzophenone tetracarboxylic dianhydride;
17. 2,2-bis(3,4-dicarboxyphenyl) propane dianhydride;
18. 1,1-bis(2,3-dicarboxyphenyl)ethane dianhydride;
19. 1,1-bis(3,4-dicarboxyphenyl)ethane dianhydride;
20. bis-(2,3-dicarboxyphenyl) methane dianhydride;
21. bis-(3,4-dicarboxyphenyl) methane dianhydride;
22. 4,4'-(hexafluoroisopropylidene)diphthalic anhydride;
23. bis-(3,4-dicarboxyphenyl) sulfoxide dianhydride;
24. tetrahydrofuran-2,3,4,5-tetracarboxylic dianhydride;
25. pyrazine-2,3,5,6-tetracarboxylic dianhydride;
26. thiophene-2,3,4,5-tetracarboxylic dianhydride;
27. phenanthrene-1,8,9,10-tetracarboxylic dianhydride;
28. perylene-3,4,9,10-tetracarboxylic dianhydride;
29. bis-1,3-isobenzofurandione;
30. bis-(3,4-dicarboxyphenyl)thioether dianhydride;
31. bicyclo[2,2,2]oct-7-ene-2,3,5,6-tetracarboxylicdianhydride;
32. 2-(3',4'-dicarboxyphenyl) 5,6-dicarboxybenzimidazole dianhydride;
33. 2-(3',4'-dicarboxyphenyl) 5,6-dicarboxybenzoxazole dianhydride;
34. 2-(3',4'-dicarboxyphenyl) 5,6-dicarboxybenzothiazole dianhydride;
35. bis-(3,4-dicarboxyphenyl) 2,5-oxadiazole 1,3,4-dianhydride;
36. bis-2,5-(3',4'-dicarboxydiphenylether) 1,3,4-oxadiazole dianhydride;
37. bis-2,5-(3',4'-dicarboxydiphenylether) 1,3,4-oxadiazole dianhydride;
38. 5-(2,5-dioxotetrahydro)-3-methyl-3-cyclohexene-1,2-dicarboxylic anhydride;
39. trimellitic anhydride 2,2-bis(3',4'-dicarboxyphenyl) propane dianhydride;
40. 1,2,3,4-cyclobutane dianhydride;
41. 2,3,5-tricarboxycyclopentylacetic acid dianhydride;
42. their acid ester and acid halide ester derivatives;
43. and the like.

The dianhydride and diamine components of the present invention are particularly selected to provide the polyimide binder with specifically desired properties. One such useful property is for the polyimide binder to have a certain glass transition temperature (Tg). A useful Tg can be between (and optionally including) any two of the following numbers: 350, 325, 300, 275, 250, 240, 230, 220, 210, 200, 190, 180, 170, 160, 150, 140, 130, 120, 110 and 100° C. Another useful range, if adherability is less important than other properties, is between (and optionally including) any of the following: 550, 530, 510, 490, 470, 450, 430, 410, 390, 370, 350, 330, 310, 290, 270, and 250° C. In some cases, a polysiloxane diamine can be used in a mole ratio (compared to the second diamine) so that the polyimide binder has lower Tg. In another case, where low Tg is required, less polysiloxane diamine can be used so long as certain flexible diamines are chosen. Useful flexible diamines here can include APB-134, APB-133, 3,4'-ODA, BAPP, BAPE, BAPS and many aliphatic diamines. As such, the selection of dianhydride and diamine component is important to customize what final properties of the polymer binder are specifically desired.

In one embodiment of the present invention useful dianhydrides include BPADA, DSDA, ODPA, BPDA, BTDA, 6FDA, and PMDA or mixtures thereof. These dianhydrides are readily commercially available and generally provide acceptable performance.

In some embodiments, the flexible dielectric middle layer is a polyimide derived from pyromellitic dianhydride, 3,3',4,4'-biphenyl tetracarboxylic dianhydride, 4,4'-diaminodiphenyl ether and paraphenylene diamine. In some embodiments, the flexible dielectric middle layer is a polyimide derived from 3,3',4,4'-benzophenone tetracarboxylic dianhydride, 3,3',4,4'-biphenyl tetracarboxylic dianhydride, 4,4'-diaminodiphenyl ether and paraphenylene diamine.

Ultimately, the precursor (polyamic acid) is converted into a high-temperature polyimide material having a solids content greater than about 99.5 weight percent. At some point in the process, the viscosity of the mixture is increased beyond the point where the thermally conductive filler material can be blended with the polyimide precursor. Depending upon the particular embodiment herein, the viscosity of the mixture can possibly be lowered again by diluting the material, perhaps sufficiently enough to allow dispersion of the thermally conductive filler material into the polyimide precursor.

Polyamic acid solutions can be converted to polyimides using processes and techniques commonly known in the art, such as, heat or conventional polyimide conversion chemistry. Such polyimide manufacturing processes are well known. Any conventional or non-conventional polyimide manufacturing process can be appropriate for use in accordance with the present invention provided that a precursor material is available having a sufficiently low viscosity to allow thermally conductive filler material to be mixed. Likewise, if the polyimide is soluble in its fully imidized state, thermally conductive filler can be dispersed at this stage prior to forming into the final composite.

Flexible Dielectric Middle Layer Filler

In some embodiments, the flexible dielectric middle layer comprises from 1 to 50 weight percent of a thermally conductive filler. The thermally conductive filler comprises one or more members of the group consisting of carbides, nitrides, borides and oxides which can be added to the polyamic acid prior to imidization to thereby create a filled polyimide. The filled polyimide will tend to have lower thermal resistance, thereby generally allowing more unwanted heat to flow away from the LEDs. In one embodiment, the polyimide film of the present disclosure comprises a thermally conductive filler:

1. being less than 5 microns (and in some embodiments, less than 2000, 1000, 800, or 500 nanometers in at least one dimension (since thermally conductive fillers can have a variety of shapes in any dimension and since thermally conductive filler shape can vary along any dimension, the "at least one dimension" is intended to be a numerical average along that dimension);
2. having an average aspect ratio equal to or greater than 1, 2, 3, 4, 5, 6, 7, 8, 9, 10, 11, 12, 13, 14, or 15 to 1;
3. being less than 100, 95, 90, 85, 80, 75, 70, 65, 60, 55, 50, 45, 40, 35, 30, 25, 20, 15 or 10 percent of the film thickness in all dimensions; and
4. being present in an amount between and optionally including any two of the following percentages: 5, 10, 15, 20, 25, 30, 35, 40, 45, 50, 55 and 60 volume percent of the polyimide film.

Suitable thermally conductive fillers are generally stable at temperatures above 300, 350, 400, 425 or 450° C., and in some embodiments do not significantly decrease the electrical insulation properties of the film. In some embodiments, the thermally conductive filler is selected from a group consisting of needle-like thermally conductive fillers (acicular), fibrous thermally conductive fillers, platelet thermally conductive fillers and mixtures thereof. In one embodiment, the thermally conductive filler is substantially non-aggregated. The thermally conductive filler can be hollow, porous, or solid.

In some embodiments, the thermally conductive filler is selected from the group consisting of oxides (e.g., oxides comprising silicon, magnesium and/or aluminum), nitrides (e.g., nitrides comprising boron and/or silicon), carbides (e.g., carbides comprising tungsten and/or silicon), borides (e.g., titanium diboride) and combinations thereof. In some embodiments, the thermally conductive filler comprises titanium dioxide, talc, SiC, $Al_2O_3$ or mixtures thereof. In some embodiments, the thermally conductive filler is less than (as a numerical average) 50, 25, 20, 15, 12, 10, 8, 6, 5, 4, or 2 microns in all dimensions. In some embodiments, the thermally conductive filler is a sub-micron thermally conductive filler.

In yet another embodiment, carbon fiber and graphite can be used in combination with thermally conductive fillers to increase mechanical properties. However in one embodiment, the loading of graphite, carbon fiber and/or electrically conductive fillers may need to be below the percolation threshold (perhaps less than 10 volume percent), since graphite and carbon fiber can diminish electrical insulation properties and in some embodiments, diminished electrical insulation properties are not desirable. In yet another embodiment, low amounts of carbon fiber and graphite may be used in combination with other fillers.

In some embodiments, the thermally conductive filler is coated with a coupling agent. In some embodiments, the thermally conductive filler is coated with an aminosilane coupling agent. In some embodiments, the thermally conductive filler is coated with a dispersant. In some embodiments, the thermally conductive filler is coated with a combination of a coupling agent and a dispersant. In some embodiments, the thermally conductive filler is coated with a coupling agent, a dispersant or a combination thereof. Alternatively, the coupling agent and/or dispersant can be incorporated directly into the film and not necessarily coated onto the thermally conductive filler. In some embodiments, the thermally conductive filler comprises acicular titanium dioxide, at least a portion of which is coated with an aluminum oxide.

In some embodiments, the thermally conductive filler is chosen so that it does not itself degrade or produce off-gasses at the desired processing temperatures. Likewise in some embodiments, the thermally conductive filler is chosen so that it does not contribute to degradation of the polymer.

In one embodiment, thermally conductive filler composites (e.g. single or multiple core/shell structures) can be used, in which one oxide encapsulates another oxide in one particle. In some embodiments, the thermally conductive filler is selected from the group consisting of spherical or near spherical shaped fillers, platelet-shaped fillers, needle-like fillers, fibrous fillers and mixtures thereof. In some embodiments, the platelet-shaped fillers and needle-like fillers and fibrous fillers will maintain or lower the CTE of the polyimide layer while still increasing the storage modulus. Useful fillers should be stable at temperatures of at least 105° C.) and not substantially decrease the electrical insulation of the polyimide film. In some embodiments, the thermally conductive filler is selected from the group consisting of mica, talc, boron nitride, wollastonite, clays, calcinated clays, silica, alumina, platelet alumina, glass flake, glass fiber and mixtures thereof. The thermally conductive filler may be treated or untreated.

In some embodiments, the thermally conductive filler is selected from a group consisting of oxides (e.g., oxides comprising silicon, titanium, magnesium and/or aluminum), nitrides (e.g., nitrides comprising boron and/or silicon) or carbides (e.g., carbides comprising tungsten and/or silicon). In some embodiments, the thermally conductive filler comprises oxygen and at least one member of the group consisting of aluminum, silicon, titanium, magnesium and combinations thereof. In some embodiments, the thermally conductive filler comprises platelet talc, acicular titanium dioxide, and/or acicular titanium dioxide, at least a portion of which is coated with an aluminum oxide. In some embodiments the thermally conductive filler is less than 50, 25, 20, 15, 12, 10, 8, 6, 5, 4, 2, 1, 0.8, 0.75, 0.65, 0.5, 0.4, 0.3, or 0.25 microns in all dimensions.

Depending on the particular filler used, too low a filler loading may have minimal impact on the film properties, while too high a filler loading may cause the polyimide to become brittle. Ordinary skill and experimentation may be necessary in selecting any particular filler in accordance with the present disclosure, depending upon the particular application selected. In some embodiments, the filler is present in an amount between (and optionally including) any two of the following weight percentages: 5, 10, 15, 10, 25, 30, 35, 40, 45, 50, 55, 60, 65 and 70 weight percent of the total weight of the polyimide flexible dielectric middle layer.

In some embodiments, the crystallinity, and amount of crosslinking of a polyimide can aid in storage modulus retention. In another embodiment, when the flexible dielectric middle layer is a polyimide, the flexible dielectric middle layer comprises a thermally stable reinforcing fabric, paper, sheet, scrim and combinations thereof in order to increase the storage modulus of the polyimide. In one embodiment, when the flexible dielectric middle layer is a polyimide, the storage modulus (DMA) at 480° C. is greater than (and optionally equal to) any of the following numbers: 190, 200, 250, 300, 350, 400, 450, 500, 550, 600, 650, 700, 750, 800, 850, 900, 950, 1000, 1100, 1200, 1300, 1400 or 1500 MPa.

The polyimides of the present disclosure should have high thermal stability so that they do not substantially degrade, lose weight and exhibit diminished mechanical properties, as well as, do not give off significant volatiles during the deposition process. In some embodiments, the polyimide has an isothermal weight loss of less than 1% measured by thermogravimetric analysis at 500° C. over 30 minutes under inert conditions, such as in a substantial vacuum, in a nitrogen or any inert gas environment.

Polyimides of the present disclosure have high dielectric strength. In some embodiments, the dielectric strength of polyimides is much higher compared to common inorganic insulators. In some embodiments, flexible dielectric middle layer of the present disclosure is a polyimide having a dielectric strength greater than 39.4 KV/mm. In some embodiments, flexible dielectric middle layer of the present disclosure is a polyimide having a dielectric strength greater than 213 KV/mm.

It is important that the flexible dielectric middle layer be as free as possible of pinhole or other defects (foreign particles, conductive particles, gels, filler agglomerates and other contaminates) that could adversely impact the electrical integrity and dielectric strength of the flexible dielectric middle layer. The term "pinhole" as used herein includes any small holes that result from non-uniformities in a layer or otherwise arising from the manufacturing process.

The flexible dielectric middle layer of the present disclosure should be thin so as to not add excessive weight or cost but thick enough to provide high electrical insulation at operating voltages. In some embodiments, the flexible dielectric middle layer has a thickness between (and optionally including) any two of the following thicknesses 8, 10, 20, 30, 40, 50, 60, 70, 80, 90 and 100 microns.

The flexible dielectric middle layer can be made thicker in an attempt to decrease defects or their impact on the layer's integrity or alternatively, multiple flexible dielectric middle layers may be used. Thin multiple layers can be advantageous over a single layer of the same thickness. Such multilayers can greatly eliminate the occurrence of through-film pinholes or defects, because the likelihood of defects that overlap in each of the individual layers is extremely small and therefore a defect in any one of the layers is much less likely to cause an electrical failure through the entire thickness of the flexible dielectric middle layer. In some embodiments, the flexible dielectric middle layer comprises two or more layers of polyimide. In some embodiments, the polyimide layers are the same or different. In some embodiments, the polyimide layers independently may comprise a thermally stable filler, reinforcing fabric, inorganic (e.g., mica) paper, sheet, scrim and/or combinations thereof.

Adhesive Layer(s)

In addition to the flexible dielectric middle layer, the flexible dielectric middle layer optionally also comprises an optional adhesive layer 12 and/or an optional adhesive layer 12'. Such adhesive layer (or layers) can be any adhesive now known or developed in the future for bonding polyimide to metal. In one embodiment, the adhesive layer comprises a thermoplastic polyimide polymer comprising at least 20 mole percent aliphatic moieties and having a glass transition temperature below 350, 300, 250, 225, 200, 190, 180, 170, 160 or 150° C.

In some embodiments, the adhesive layer 12 is polyimide derived from 4,4'-oxydiphthalic anhydride, pyromellitic dianhydride and 1,3-bis-(4-aminophenoxy)benzene. In some embodiments, the adhesive layer 12' is polyimide derived from 4,4'-oxydiphthalic anhydride, pyromellitic dianhydride and 1,3-bis-(4-aminophenoxy)benzene.

The polyimide provides structure integrity and mechanical strength to the flexible dielectric middle layer, while the adhesive layer(s) 12 and/or 12' provide fracturability to allow improved bending capability with diminished necking, bulging or other unwanted incongruity otherwise induced by the bending of the flexible layered structure.

In one embodiment, the flexible layered structure comprises a top adhesive layer bonding the flexible top conductive layer to the flexible dielectric middle layer. In another embodiment, the flexible layered structure comprises a bottom adhesive layer bonding the flexible dielectric middle layer to the flexible bottom heat sink layer. In yet another embodiment, the flexible layered structure comprises a top adhesive layer bonding the flexible top conductive layer to the flexible dielectric middle layer and a bottom adhesive layer bonding the flexible dielectric middle layer to the flexible bottom heat sink layer.

Flexible Top Conductive Layer and Flexible Bottom Heat Sink Layer

Prior to circuitization, in one embodiment the flexible top conductive layer is a metal, such as copper approximately 4 to 200 microns in thickness. Although copper is a preferred conductive material, it is recognized that other suitable electrically conductive materials such as, but not limited to, aluminum could be used. The top conductive copper layer can be circuitized to include a thermally conductive printed or etched electrical circuit using standard electrical circuit design tools and techniques well known in the art and is then optionally coated with a protective coating using standard solder masking and labeling techniques well known in the art. An example of a suitable protective coating that could be used is PYRALUX® PC1000 Flexible Photoimageable Coverlay by DuPont of Wilmington Del.

The flexible top conductive layer is designed in such a way as to provide receptacles and mounting surfaces for LEDs and other SMT electrical components proximate the top surface. The flexible top conductive layer includes a plurality of LED receptacles to which LEDs are operatively connected. The electrical circuit and the LED receptacles can be made of copper and receive a lead free hot air solder level (HASL) or organic solder protection (OSP) coating. These coatings protect the flexible top conductive layer surface from oxidization during storage, prior to assembly, enhancing solderability of SMT components.

In one embodiment, prior to circuitization, the bottom flexible bottom heat sink layer is copper with a thickness greater than 20 microns. Although copper is a preferred material, it is recognized that other suitable electrically conductive materials such as, but not limited to, aluminum could be used. In one embodiment, the flexible bottom heat sink layer is modified into a heat spreading copper circuit laterally and along its longitudinal axis proximate the bottom surface using standard electrical circuit design tools and techniques well known in the art to rapidly spread the heat through the flexible bottom heat sink layer. In one embodiment, the flexible bottom heat sink layer includes a thermally conductive electrical circuit printed or etched using solder mask printing, photo etching, and/or solder masking techniques well known in the art for producing electrical circuits. Such electrical circuit can be used to conduct heat away from the top conductive surface and can also be used as an electrical circuit. In alternative embodiments, the flexible bottom heat sink layer is a solid layer with no electrical circuit.

In one embodiment, the flexible top heat sink layer is electrically connected to the bottom heat sink layer by means of plated through holes. In one embodiment, the plated through holes are filled with thermally conductive filler to enhance thermal path from the flexible top to flexible bottom heat sink layer.

Optionally, the flexible layered structure may also include a heat sink adhesive layer. The heat sink adhesive layer can be a two-sided thermally conductive tape with two removable layers of protective backing. One of the removable layers of protective backing is removed to expose one side of the heat sink adhesive layer, which is then operatively connected to the bottom surface of the flexible bottom heat sink layer. When it is later desired to operatively connect the flexible layered structure to a secondary heat sink, the second removable layer of release liner is removed to expose the other side of the heat sink adhesive layer. The heat sink adhesive layer can thereby provide thermal contact between the flexible layered structure and the secondary heat sink and the heat sink adhesive layer is optionally capable of filling large voids and air gaps to improve thermal conductivity.

An example of a suitable heat sink adhesive layer is 3M® Thermally Conductive Adhesive Transfer Tape 8810. Although a two-sided thermally conductive tape is used in this particular embodiment, it is recognized that other suitable thermally conductive connecting materials could be used.

Figure 3:
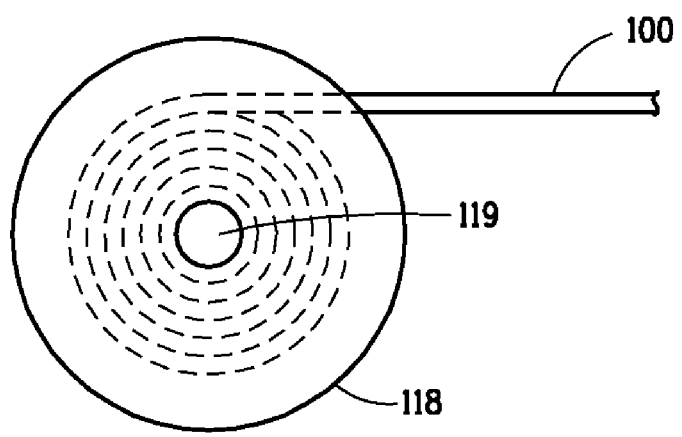
FIG. 3 is a side view of a reel onto which the flexible layered structure shown in FIG. 1 could be wound.

In one embodiment, the flexible layered structure is an integral, flexible layered structure that is sufficiently flexible to be easily bent in angles of 1 to 180 degrees and/or is sufficiently flexible to substantially or fully follow the contour of complex, three dimensional shapes. In one embodiment, the flexible layered structure 100 can bend laterally along a plurality of defined positions spaced along the length of the longitudinal axis to an outside bend radius of less than 2.0 mm (0.078 inch) and can be wrapped about a longitudinal axis of a hub 119 of a reel 118, as shown in FIG. 3. Although only one position is shown, it is recognized that there are a plurality of positions spaced along the length of the longitudinal axis. In one embodiment, the flexible layered structure can also bend to conform to localized secondary heat sink surface flatness variations having an outside bend radius of less than at least 2.0 mm (0.078 inch). By conforming to variations in heat sink base material shapes, heat transfer from the LEDs generally is greatly improved.

In some embodiments, the flexible layered structure is conformed to at least a portion of a secondary heat sink and bonded to the secondary heat sink by at least a portion of the heat sink adhesive layer. In some embodiments, the flexible layered structure being at least partially bent around a longitudinal axis.

The flexible layered structure can be pre-populated with a plurality of LEDs and other Surface Mount Technology (hereinafter "SMT") electrical components well known in the art for completion of a solid state lighting electrical circuit cable of producing light. An example of a pre-populated flexible layered structure could include the flexible layered structure, a plurality of LEDs positioned longitudinally along the circuit approximately every few centimeters, linear drivers positioned longitudinally between every sixth LED and seventh LED, and connectors for power placed longitudinally approximately every meter. An example of a suitable LED is XPE manufactured by CREE Incorporated of Raleigh, N.C. An example of a suitable liner driver is NU D4001 manufactured by ON Semiconductor of Phoenix, Ariz.

In one embodiment, the flexible layered structure may be cut to any desired length, cutting at pre-defined electrical circuit locations according to the electrical circuit's design. In one embodiment, a connector is operatively connected to the flexible layered structure to provide power to the LED system, and if it is desired to connect two flexible layered structures together, a board to board connector could be used. Such connectors are well known in the art.

Heat generated proximate the LED p-n junction is conducted from the LED chip to the LED heat sink slug as designed by the LED manufacturer. The LED heat sink slug typically is less than 0.25 inch (0.635 centimeter) in diameter or 0.050 inch (0.127 centimeter) squared proximate the LED's base. When electrically driven, the heat generated by the LED and transferred to the LED heat sink slug can range from 1 to 5 Watts or more per 0.8 inch (2.032 centimeters) squared when applied to an adequate assembly heat sink. It is important to remove the heat away from the LED p-n junction to maintain the manufactures' specifications for normal operation proximate the p-n junction.

The flexible layered structure provides a path for heat to be spread through the flexible top conductive layer, through the flexible dielectric middle layer, and into the flexible bottom heat sink layer. The flexible bottom heat sink layer can provide a path for the heat to spread laterally and longitudinally proximate over the top surface of a secondary heat sink to which the flexible layered structure can be operatively connected. In some embodiments, the heat sink adhesive layer is thermally conductive. The heat sink adhesive layer provides an interface layer which fills the voids between the flexible bottom heat sink layer and the mounting surface of the secondary heat sink. Should there be any voids or air gaps in the mounting surface of the heat sink, the heat sink adhesive layer can be used to fill in the voids and air gaps, even if less than 50 microns (in at least one dimension), thus reducing the amount of voids and air gaps and increasing the amount of thermal transfer to the heat sink. The flexible layered structure can therefore substantially conform to the heat sink and thereby provide the necessary thermal transfer capabilities necessary for high wattage LED lighting systems. Should it be desired to connect a flexible layered structure to another flexible layered structure, a board to board connector could be used.

The flexible layered structure can be advantageous for any one of a number of reasons. For example, the circuit design proximate the top surface of the flexible top conductive layer can be made relatively thin and therefore less expensively, since heat can be dissipated without a large amount of heat absorbing metal in the electrical circuit or the flexible top conductive layer. The flexible top conductive layer and the flexible dielectric middle layer can be made sufficiently thin to allow easy flexibility and bending or twisting while maintaining electrical integrity. The flexible bottom heat sink layer can also be made relatively thin to allow flexibility and bending, since additional heat dissipation is possible by adhering the flexible bottom heat sink layer to a secondary heat sink separate and apart from the flexible layered structure.

In this way, the flexible layered structure can be configured into a three dimensional lighting configuration and then incorporated into a lighting structure comprising a secondary heat sink. With an appropriate secondary heat sink, it is possible to obtain a thermal conductivity of greater than 300, 400, 500, 600, 700 or 750 Watts per meter per degree Kelvin (W/m° K).

The flexible dielectric middle layer provides electrical isolation of the LED for proper electrical functionality with breakdown voltage greater than 2, 3, 4, 5, 6, 7.5 kV or greater. Also, the adhesive layers can be thermally conductive adhesive, such as by loading with thermally conductive filler, thereby improving the heat transfer path to the flexible bottom heat sink layer and also the optional secondary heat sink.

Secondary Heat Sink

In one embodiment, the secondary heat sink is a plurality of separate secondary heat sinks that are bonded to the flexible layered structure. The flexible layered structure can be wrapped around, thereby forming a cylinder type configuration interconnecting the secondary heat sink. In some embodiments, the electrical circuit on the flexible top conductive layer of the flexible layered structure is sufficiently robust to allow such bending and twisting without detriment to the electrical connections between the LED lights.

Hence, a series of secondary heat sink can be placed in a plane and the flexible layered structure of the present disclosure can be pulled over the assembly components, a release liner can be removed and the exposed heat sink adhesive layer can then be pressed onto the secondary heat sink, thereby adhering the secondary heat sink to the flexible layered structure. The combination can then be bent or otherwise manipulated into a final configuration to provide a lighting assembly where at least two of the LED lights shine in different directions.

Due to the flexibility of the flexible layered structure, virtually any configuration of a secondary heat sink can be used over which or around which the flexible layered structure of the present disclosure can be bonded. The flexible layered structure is sufficiently pliable to accommodate virtually any three dimensional configuration of a secondary heat sink. In one embodiment, the secondary heat sink can be part of a "screw in," "plug in" or similar-type housing, so the final assembly can be configured as a replacement for a conventional light bulb.

Operatively connecting the pre-populated, flexible layered structure to the secondary heat sink includes removing the flexible layered structure from its storage container, laying out a desired length of the flexible layered structure from a reel and cutting the desired length (if applicable), removing the release liner (if applicable), placing the flexible layered structure onto a desired location on the secondary heat sink, and applying pressure onto the flexible layered structure proximate the flexible top conductive layer avoiding any sensitive electrical components (if applicable). In one embodiment, standard electro static discharge ("ESD") precautions should be followed. In some embodiments, direct pressure should not be applied to pressure sensitive devices, such as LEDs with optical components. In one embodiment, manual pressure with one's finger(s) of approximately 13.8 kilo-Newtons/square meter) along 90% or more of the flexible layered structure should be sufficient for connection to the heat sink. In some embodiments, a roller or other applicator device could also be used. In one embodiment, once the flexible layered structure 100 is connected to a heat sink, the circuits can be connected to a termination board, which supplies power to the system as is well known in the art. If an adhesive layer is not used, the flexible layered structure could be connected with thermal paste adhesive, thermal grease with mechanical fastening, or other suitable securing means.

The flexible layered structure can be a low cost, flexible structure consisting in part of a very thin and flexible printed circuit substrate and a thermally conductive adhesive layer, which when operatively connected to a secondary heat sink produces a highly useful thermal interface with the secondary heat sink, thus achieving overall advantageous system thermal performance. The circuit structure is designed in such a way as to allow the copper pads on the flexible top conductive layer to spread heat across the top surface. In one embodiment, the thin, flexible dielectric middle layer allows conduction of heat from the copper circuit area on the top surface to an even larger (nearly full coverage) copper on the flexible bottom heat sink layer, which in turn can be in thermal communication with a secondary heat sink.

In one embodiment, at least two high power LEDs are soldered onto the desired LED receptacles on the top surface of the flexible layered structure. When electrical current is passed through the circuit on the top surface of the flexible top conductive layer, the LEDs facing different directions are energized and emit visible light. Based on the heat sink structure of the high power LED lamp, heat generated from the electrical current passed through the LED is conducted to a heat sink slug on the bottom of the LED. The efficiency of the LED and corresponding light output performance is a direct function of the junction temperature ("Tj") of the LED with heat reducing the efficiency of light production according to the manufacturer's specifications. The flexible layered structure of the present invention works to rapidly spread heat away from the LED heat sink slug proximate the top surface and correspondingly rapidly conducts heat away from the flexible top conductive layer, into the bottom electrically isolated copper area, into the flexible bottom heat sink layer, and optionally to a secondary heat sink.

The flexible layered structure is able to efficiently conduct heat away from LED lights, while at the same time maintaining the flexible properties of the flexible layered structure. The rapid spreading of heat away from the LEDs leads to lower Tj values, higher light output, and higher component reliability. In one embodiment, another benefit of a flexible, flexible layered structure of the present disclosure is the further enhancement of thermal performance due to the ability of a thin thermally conductive adhesive layer to conform to both the copper portion of the flexible bottom heat sink layer and the eventual secondary heat sink. The ability of the flexible, flexible layered structure to conform to the secondary heat sink allows for improved intimate thermal contact on curved (and less than perfectly flat) secondary heat sink surfaces.

LED Light Assemblies

The flexible layered structures of the present disclosure can be incorporated into LED lighting assemblies, as follows:
1. the flexible layered structure is pulled from a reel or alternatively, pulled from a stack of panels or sheets;
2. the release layer is pulled away, exposing the heat sink adhesive;
3. the heat sink adhesive layer is applied to a secondary heat sink, either a single heat sink component or a plurality of heat sink components;
4. the heat sink(s) can be configured in their final three dimensional configuration prior to application of the flexible layered structure or bent to a particular 3 dimensional configuration after application of the flexible layered structure;
5. the flexible top conductive layer is circuitized at any point in the process; and
6. the LEDs can be applied to the circuitized flexible top conductive layer of the flexible layered structure immediately after circuitization or can be applied further downstream in the process.

In some embodiments a LED lighting assembly can be used as a replacement light for an A19 type light bulb. Other final LED lighting assemblies that could be adapted in accordance with the present disclosure and configured sufficient to provide one or more of the following types of lights:
1. cove lights;
2. residential overhead lights;
3. linear lights;
4. rope lights;
5. accent lights;
6. projector lights;
7. stage bar lights;
8. par lamp lights;
9. linear lights;
10. color changer lights;
11. display case lights;
12. undercabinet lights;
13. backdrop lights;
14. accent lights;
15. refrigerated display case lights;
16. hazardous lights;
17. industrial fixture lights;
18. functional office lights;
19. down lights;
20. recessed lights;
21. roadway lights;
22. canopy lights;
23. area lights;
24. pole top lights;
25. solar flood lights;
26. lantern lights;
27. decorative suspended lights;
28. task lights;
29. flash light;
30. headlamps;
31. work lights; and
32. exit sign lights.

The LED lighting assemblies of the present invention may also be configured to include any of the following types of replacement bulbs:

1. A-lamp bulbs;
2. PAR and R-Lamp bulbs;
3. MR16 bulbs;
4. candelabra bulbs; and
5. linear fluorescent bulbs In some embodiments, the LED lighting assembly has a light bulb replacement configuration sufficient to be a replacement for one or more of the following: A-lamp bulbs, PAR-lamp bulbs, R-lamp bulbs, MR16-lamp bulbs, candelabra lamp bulbs and linear fluorescent bulbs.

The flexible layered structure for use with high power light emitting diode system or secondary heat sink can be fabricated in any one of a number of ways, such as:
1. cold sizing;
2. extrusion;
3. forging;
4. hot metal gas forming;
5. powder metallurgy; and
6. forming by mechanical force at room temperature, such as:
   a. bending;
   b. coining;
   c. decambering;
   d. deep drawing;
   e. drawing;
   f. spinning;
   g. flow turning;
   h. raising;
   i. roll forming;
   j. roll bending;
   k. repousse and chasing;
   l. rolling;
   m. rubber pad forming;
   n. shearing;
   o. stamping;
   p. wheel machining; and
   q. the like.

LED lighting assembly of the present disclosure comprises
   i. a flexible top conductive layer comprising a first conductive metal, the flexible top conductive layer having a thickness from 4 to 100 microns;
   ii. a flexible bottom heat sink layer comprising a second conductive metal and the flexible bottom heat sink layer having a thickness of at least 50 microns;
   iii. a flexible dielectric middle layer comprising a polymer, the flexible dielectric middle layer having a thickness from 4 to 100 microns and providing electrical insulation between the flexible top conductive layer and the flexible bottom heat sink layer;
   the first conductive metal of the flexible top conductive layer being the same or different from the second conductive metal of the flexible bottom heat sink layer;
   said LED lighting assembly having a longitudinal axis and a plurality of defined positions spaced along the longitudinal axis, and being bent at least 10 degrees proximate at least one of the plurality of defined positions spaced along the longitudinal axis or being twisted relative to the longitudinal axis; and
   wherein at least a portion of the plurality of defined positions comprise an LED and wherein the LED is in electrical communication with a circuit.

In some embodiments, the LED lighting assembly is conformed to at least a portion of a secondary heat sink and bonded to the secondary heat sink by at least a portion of a heat sink adhesive layer.

In some embodiments, at least 50 weight percent of the flexible dielectric middle layer is a polyimide derived from at least 30 mole percent aromatic dianhydride based upon total dianhydride content of the polyimide and at least 30 mole percent aromatic diamine based upon total diamine content of the polyimide.

In some embodiments, the LED lighting assembly has a flexible dielectric middle layer comprising 1 to 50 weight percent thermally conductive filler, the thermally conductive filler comprising one or more members of the group consisting of carbides, nitrides, borides and oxides.

In some embodiments, a method of making an LED lighting assembly comprises:
   a) pulling a flexible layered structure from a reel or from a stack of panels or sheets, the flexible layered structure comprising:
      i. a flexible top conductive layer comprising a first conductive metal, the flexible top conductive layer having a thickness from 4 to 200 microns;
      ii. a flexible bottom heat sink layer comprising a second conductive metal and the flexible bottom heat sink layer having a thickness of at least 50 microns;
      iii. a flexible dielectric middle layer comprising a polymer, the flexible dielectric middle layer having a thickness from 4 to 100 microns and providing electrical insulation between the flexible top conductive layer and the flexible bottom heat sink layer;
      iv. a heat sink adhesive layer; and
      v. a release liner
   wherein the first conductive metal of the flexible top conductive layer being the same or different from the second conductive metal of the flexible bottom heat sink layer, and the flexible layered structure has a longitudinal axis and a plurality of defined positions spaced along the longitudinal axis, the flexible layered structure being bendable at least 10 degrees proximate at least one of the plurality of defined positions spaced along the longitudinal axis and the flexible layered structure also being twistable relative to the longitudinal axis,
   b) removing the release liner thereby exposing a the heat sink adhesive layer,
   c) applying the heat sink adhesive layer to a secondary heat sink, thereby adhering at least a portion of the flexible layered structure to the secondary heat sink;
   d) configuring the flexible layered structure with the release liner removed into a three dimensional configuration and
   wherein at any time before, during or after during the above method steps, the flexible top conductive layer is circuitized and thereafter at least two LEDs are applied to the flexible top conductive layer of the flexible layered structure.

In some embodiments, the flexible layered structure is bent into a light bulb replacement configuration sufficient for the LED lighting assembly to be a replacement for one or more of the following: down lights A-lamp bulbs, PAR-lamp bulbs, R-lamp bulbs, MR16-lamp bulbs, candelabra lamp bulbs and linear fluorescent bulbs.

In some embodiments, the flexible layered structure is bent into a configuration sufficient to provide one or more of the following types of lights:
   cove lights;
   residential overhead lights;
   linear lights;
   rope lights;
   accent lights;
   projector lights;
   stage bar lights;
   par lamp lights;
   color changer lights;

display case lights;
undercabinet lights;
backdrop lights;
refrigerated display case lights;
hazardous lights;
industrial fixture lights;
functional office lights;
down lights;
recessed lights;
roadway lights;
canopy lights;
area lights;
pole top lights;
solar flood lights;
lantern lights;
decorative suspended lights;
task lights;
flash light;
headlamps;
work lights; and
exit sign lights.

In some embodiments, additional benefits of the flexible layered structure are the utility and cost savings of building reeled, pre-populated, high wattage LED systems. The flexible layered structure provides a substrate on which surface mounted, higher wattage LEDs can be mounted and then reeled onto a cored reel. Reeled continuous linear strips of high wattage LEDs can be easily handled and applied to secondary heat sinks during manufacturing assembly.

The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. An LED lighting assembly comprising:
   i. a flexible top conductive layer comprising a first conductive metal, the flexible top conductive layer having a thickness from 4 to 100 microns;
   ii. a flexible bottom heat sink layer comprising a second conductive metal and the flexible bottom heat sink layer having a thickness of at least 10 microns;
   iii. a flexible dielectric middle layer comprising a polymer, the flexible dielectric middle layer having a thickness from 4 to 100 microns and providing electrical insulation between the flexible top conductive layer and the flexible bottom heat sink layer;
   the first conductive metal of the flexible top conductive layer being the same or different from the second conductive metal of the flexible bottom heat sink layer;
   said LED lighting assembly comprising a notch and having a longitudinal axis and a plurality of defined positions spaced along the longitudinal axis, and being bendable at least 10 degrees proximate at least one of the plurality of defined positions spaced along the longitudinal axis or being twisted relative to the longitudinal axis;
   wherein at least 50 weight percent of the flexible dielectric middle layer is a polyimide derived from at least 30 mole percent aromatic dianhydride based upon total dianhydride content of the polyimide and at least 30 mole percent aromatic diamine based upon total diamine content of the polyimide, and
   wherein at least a portion of the plurality of defined positions comprise an LED and wherein the LED is in electrical communication with a circuit.

2. The LED lighting assembly in accordance with claim 1 having a light bulb replacement configuration sufficient to be a replacement for one or more of the following: A-lamp bulbs, PAR-lamp bulbs, R-lamp bulbs, MR16-lamp bulbs, candelabra lamp bulbs and linear fluorescent bulbs.

3. The LED lighting assembly in accordance with claim 1 having a configuration sufficient to provide one or more of the following types of lights:
   cove lights;
   residential overhead lights;
   linear lights;
   rope lights;
   accent lights;
   projector lights;
   stage bar lights;
   par lamp lights;
   color changer lights;
   display case lights;
   undercabinet lights;
   backdrop lights;
   refrigerated display case lights;
   hazardous lights;
   industrial fixture lights;
   functional office lights;
   down lights;
   recessed lights;
   roadway lights;
   canopy lights;
   area lights;
   pole top lights;
   solar flood lights;
   lantern lights;
   decorative suspended lights;
   task lights;
   flash light;
   headlamps;
   work lights; and
   exit sign lights.

4. The LED lighting assembly in accordance with claim 1, wherein the LED lighting assembly is conformed to at least a portion of a secondary heat sink and bonded to the secondary heat sink by at least a portion of a heat sink adhesive layer.

5. The LED lighting assembly in accordance with claim 1 wherein the flexible dielectric middle layer comprises 1 to 50 weight percent thermally conductive filler, the thermally conductive filler comprising one or more members of the group consisting of carbides, nitrides, borides and oxide.

* * * * *